US007950831B2

(12) United States Patent
Moon

(10) Patent No.: US 7,950,831 B2
(45) Date of Patent: May 31, 2011

(54) RECESSED LED LAMP UNIT

(75) Inventor: Jeong Min Moon, Gunpo-shi (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 11/116,177

(22) Filed: Apr. 28, 2005

(65) Prior Publication Data

US 2005/0243577 A1     Nov. 3, 2005

(30) Foreign Application Priority Data

Apr. 29, 2004 (KR) .................. 10-2004-0030072

(51) Int. Cl.
*F21V 5/04* (2006.01)
(52) U.S. Cl. ......... 362/308; 362/328; 362/329; 362/235
(58) Field of Classification Search .................. 362/612, 362/617, 800, 235, 238, 240, 244, 241, 243, 362/245, 246, 247, 615, 619, 623, 625, 311, 362/561, 97, 26–30, 607, 610, 613, 327, 362/329, 308, 555, 223, 224, 337, 545, 97.1–97.3, 362/328, 249.02; 257/98; 349/62
See application file for complete search history.

(56) References Cited

U.S. PATENT DOCUMENTS

| 3,746,853 | A | * | 7/1973 | Kosman et al. | ............... 362/301 |
| 4,259,679 | A | * | 3/1981 | Knibb et al. | ................. 257/98 |
| 4,906,075 | A | * | 3/1990 | Matsumiya | .................. 359/267 |
| 5,865,529 | A | * | 2/1999 | Yan | ............................. 362/327 |
| 6,404,131 | B1 | * | 6/2002 | Kawano et al. | ................. 315/82 |
| 2002/0163810 | A1 | | 11/2002 | West et al. | |
| 2002/0180370 | A1 | * | 12/2002 | Ohno et al. | ................ 315/169.3 |
| 2003/0020677 | A1 | | 1/2003 | Nakano | |
| 2004/0042194 | A1 | * | 3/2004 | Hsieh | .............................. 362/31 |
| 2004/0085779 | A1 | * | 5/2004 | Pond et al. | .................... 362/516 |
| 2004/0208003 | A1 | * | 10/2004 | Kuo | ............................. 362/241 |

FOREIGN PATENT DOCUMENTS

| CN | 1400488 | 3/2003 |
| JP | 49-004573 | 1/1974 |
| JP | 56-123572 | 9/1981 |
| JP | 63-020464 | 2/1988 |
| JP | 05-183194 | 7/1993 |
| JP | 06-011365 | 2/1994 |

(Continued)

OTHER PUBLICATIONS

English Machine Translation (Claims, Detailed Description) of Japanese Publication JP 2000299500 A.*

*Primary Examiner* — Thomas M Sember
(74) *Attorney, Agent, or Firm* — McKenna Long & Aldridge LLP

(57) ABSTRACT

A light emitting diode (LED) lamp unit for obtaining a thin profile display device, to improve uniformity of light, and to simplify a power connection line for operation. The LED lamp unit includes an optical lens having a central recess part and an edge, wherein the central recess part is hollowed out inwardly, and the edge is formed in shape of a flat surface or in shape of a convex lens; at least one or more LED chips arranged at fixed intervals in a lower portion of the optical lens; and a lower reflecting sheet positioned on a bottom surface of the LED chip.

44 Claims, 22 Drawing Sheets

FOREIGN PATENT DOCUMENTS

| | | |
|---|---|---|
| JP | 07-003154 | 1/1995 |
| JP | 09-018058 | 7/1997 |
| JP | 10-276298 | 10/1998 |
| JP | 2000-270161 | 9/2000 |
| JP | 2000-299500 | 10/2000 |
| JP | 2000299500 A * | 10/2000 |
| JP | 2002-299694 | 10/2002 |
| JP | 2003-008081 | 1/2003 |
| JP | 2004-087630 | 3/2004 |
| JP | 2005-044661 | 2/2005 |
| KR | 10-2003-0080057 | 10/2003 |

* cited by examiner

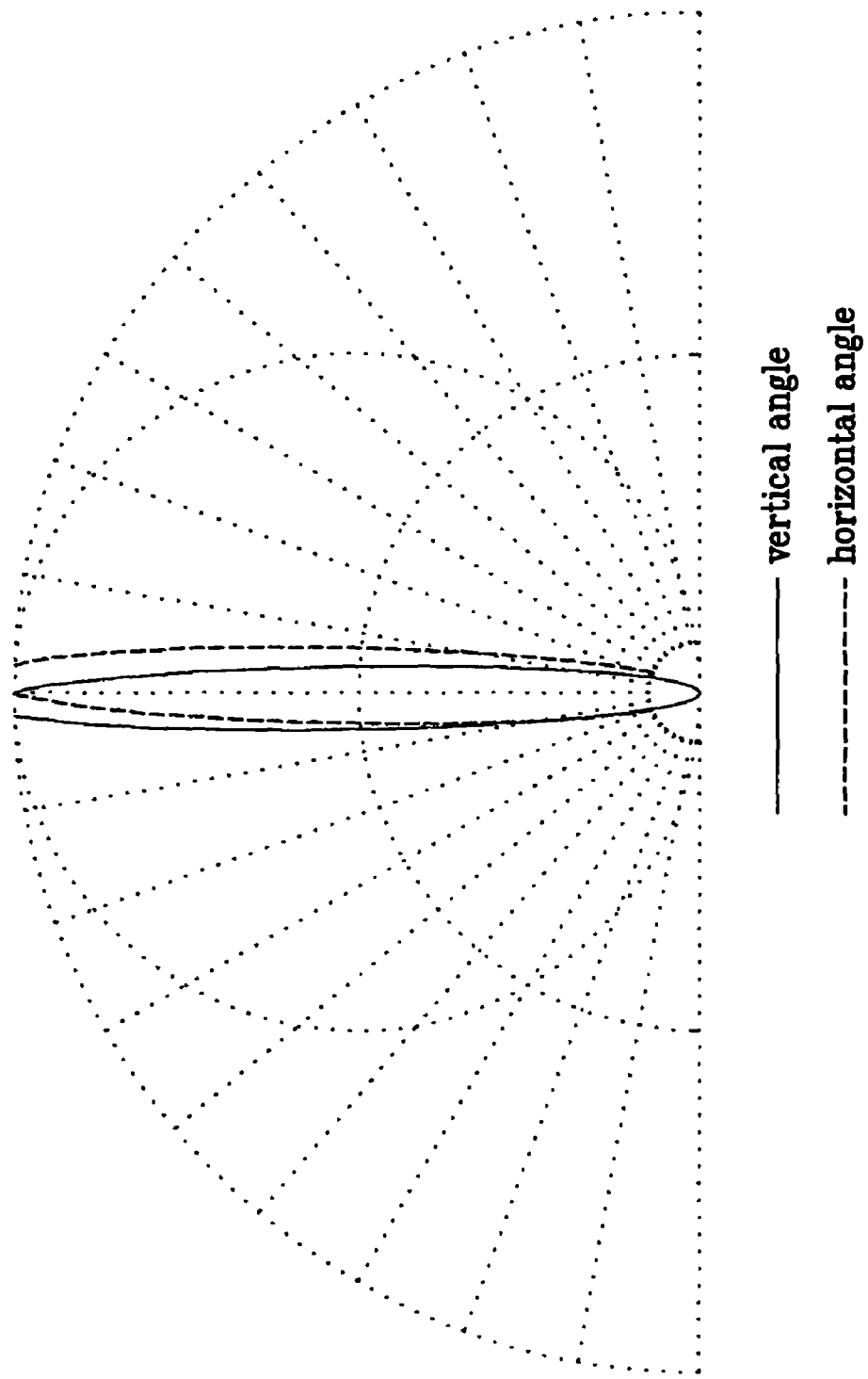

US 7,950,831 B2

RECESSED LED LAMP UNIT

This application claims the benefit of the Korean Application No. P2004-30072 filed on Apr. 29, 2004, which is hereby incorporated by reference for all purposes as if fully set forth herein.

BACKGROUND OF THE INVENTION

1. Field of the Invention

The present invention relates to a backlight unit of a liquid crystal display (LCD) device, and more particularly, to a light emitting diode (LED) lamp unit, to obtain a thin profile, to improve the uniformity of light, and to simplify the power connection line for the operation of the device.

2. Discussion of the Related

In general, cathode ray tubes (CRTs), which are one type of display device, have been widely used as monitors for televisions, measuring apparatuses, and information terminals. However, the CRT cannot satisfy the demand for compact size and light weight devices due to the size and weight of the CRT itself. Thus, various display devices, such as liquid crystal display (LCD) devices that use the electric field optical effect, plasma display panels (PDP) using a gas discharge, and electroluminescence display (ELD) devices using an electric field luminous effect, have been studied to substitute the CRT.

Among the display devices, the LCD device has been extensively researched, so that the LCD device having low power consumption, slim size and light weight is in active development and production as monitors for desktop computers (or personal computers) and large sized display devices, as well as laptop computers (or notebook computers). Accordingly, LCD devices are popular. Most LCD devices control the light transmittance of ambient light to display an image. In this respect, it is often necessary to provide an additional light source, such as a backlight unit, to emit light to the LCD panel of the LCD device.

The backlight unit is generally used to read information displayed on a screen of the LCD device in dark surroundings. Backlight units often have a thin light-guiding plate because of the demand for good design, low power consumption, and thin profile. Also, there are research to further develop the function of representing various colors and of improving the display grade by using a light emitting diodes (LED) are ongoing.

Generally, the LED is a solid device using the photoelectric conversion characteristics of a semiconductor, and more particularly the LED is a semiconductor device of emitting light when a forward voltage is applied thereto. In comparison to a lamp of using tungsten filaments, the LED emits light at a lower voltage. Lamps using tungsten filaments emit light by heating the filaments. Meanwhile, the LED emits light with the energy difference generated by the recombination of electrons and holes. Accordingly, the LED is in widespread use for various display devices.

When an A.C. voltage of several values is applied to the LED, the LED emits light. With an LED, there is no requirement for providing a DC-AC converter to a driving unit, whereby the driving unit has a simplified structure. Also, since the LED is the semiconductor device, the LED has high reliability, compact size and long lifespan as compared with the CRT.

Hereinafter, a general LED lamp, which can be used for a light-emitting device by itself or for a light source of a display device will be described with reference to the accompanying drawings.

FIG. 1A is a photograph of a general LED lamp unit. FIG. 1B is a cross sectional view of a general LED lamp unit. FIG. 2 illustrates a progressing path of light emitted from an LED lamp of FIG. 1A and FIG. 1B. FIG. 3A illustrates rectangular coordinates of the relative intensity characteristics of light by an angular degree of a general LED lamp unit. FIG. 3B illustrates polar coordinates of the relative intensity characteristics of light by an angular degree of a general LED lamp unit.

As illustrated in FIG. 1A and FIG. 1B, the general LED lamp unit includes an LED chip 10, a bullet-shaped optical lens 13, cathode and anode lead wires 14 and 15, and a reflecting curve 11. The bullet-shaped optical lens 13 covers the LED chip 10, and the cathode and anode lead wires 14 and 15 are connected with both ends of the LED chip 10. Also, the reflecting curve 11 covers the side of the LED chip 10. Herein, a non-explained reference number 12 is a wire for connecting the LED chip 10 with the cathode lead wire 14 and the anode lead wire 15.

With an LED lamp having the aforementioned structure, the light emitted from the LED chip 10 is mostly concentrated on the optical lens 13, whereby the light is progressing to the vertical direction, as illustrated in FIG. 2.

In FIG. 3A and FIG. 3B, it illustrates the relative intensity characteristics of light by an angular degree of the general LED panel. As illustrated in FIG. 3A and FIG. 3B, the light emitted from the LED chip 10 is mostly progressing to the vertical direction. In this case, the light emitted from the LED lamp is concentrated on and is progressing to one direction (vertical direction). Accordingly, it is impossible to apply the LED lamp unit to the backlight unit of requiring the uniformity of light on the entire area. In order to apply the LED lamp unit to the backlight unit, it is necessary to provide a plurality of LED lamps. In addition, the LED lamp unit requires additional optical elements for scattering the light emitted from the LED lamp.

Hereinafter, a related art LED lamp unit having an improved structure, for solving the problem of the general LED lamp in which the light is concentrated in vertical, will be described as follows.

FIG. 4 is a schematic view of an LED lamp unit according to the related art. FIG. 5 is a perspective view of an optical lens of an LED lamp unit of FIG. 4 according to the related art. FIG. 6 illustrates a relative intensity according to an angular degree of an LED lamp unit of FIG. 4.

As illustrated in FIG. 4 and FIG. 5, a related art LED lamp 40 includes a mortar-shaped optical lens 50 and an LED chip (not illustrated), wherein the mortar-shaped optical lens 50 is suitable for a side emitting type, and the LED chip is positioned inside the mortar-shaped optical lens 50.

Referring to FIG. 6, the light emitted from the LED chip is progressing to the side direction through the optical lens 50 since the optical lens 50 is formed in shape of mortar. Accordingly, in case the related art LED lamp unit is applied to the backlight unit, it is possible to obtain the great luminance with the smaller number of the LED lamps, as compared with the number of the LED lamps in case of using the general LED lamp unit.

However, the related art LED lamp unit has the following disadvantages.

First, with a related art LED lamp unit, the light emitted from the LED lamp is progressing to the side direction since the optical lens is formed in shape of mortar. However, it is impossible to obtain the thin profile due to the thickness of the optical lens.

Also, the upper edge of the optical lens is thin, so that the upper edge of the optical lens may be easily damaged due to the external force. Also, in case the optical lens is heavily damaged, the characteristics of light emitted from the LED lamp may be changed.

SUMMARY OF THE INVENTION

Accordingly, the present invention is directed to an LED lamp unit that substantially obviates one or more problems due to limitations and disadvantages of the related art.

An advantage of the present invention is to provide an LED lamp unit, to obtain thin profile.

Another advantage of the present invention is to provide an LED lamp unit, to improve uniformity of light by changing the characteristics of light emitted from the lamp.

Another advantage of the present invention is to provide an LED lamp unit, to simplify a power connection line for operation.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these other advantages and in accordance with the purpose of the invention, as embodied and broadly described herein, an LED lamp unit includes an optical lens having a central recess part and an edge, wherein the central recess part is hollowed inwardly, and the edge is formed in shape of a flat surface or in shape of a convex lens; at least one or more LED chips arranged at fixed intervals in a lower portion of the optical lens; and a lower reflecting sheet positioned on a bottom surface of the LED chip.

At this time, the central recess part is formed in shape of 'V'.

Also, the central recess part of the optical lens has a flat surface or a curved surface.

Furthermore, the LED lamp unit includes an upper reflecting sheet formed on an upper surface of the optical lens.

Also, the upper reflecting sheet is formed by adhesion of a reflecting sheet, by coating of a reflecting material, or by processing a surface with a functional sheet.

In addition, the LED lamp unit includes a light-absorbing film or a light-scattering film on the upper surface of the optical lens. The light-absorbing film may be formed of a black sheet. In addition, the light-scattering film may be formed in a method of roughing a surface of a film, or in a method of coating irregular particles on a surface of a film.

In state both ends in each of the LED chips are connected with each of anode electrode terminals and each of cathode electrode terminals by lead, the anode electrode terminals of the plurality of LED chips are separately connected, and the cathode electrode terminals of the plurality of LED chips are separately connected.

In state both ends in each of the LED chips are connected with each of anode electrode terminals and each of cathode electrode terminals by lead, the anode electrode terminals of the plurality of LED chips are separately connected, and the cathode electrode terminals of the plurality of LED chips are connected in common by a first electrode connection wire.

In state both ends in each of the LED chips are connected with each of anode electrode terminals and each of cathode electrode terminals by lead, the anode electrode terminals of the plurality of LED chips are connected in common by a second electrode connection wire, and the cathode electrode terminals of the plurality of LED chips 150 are separately connected.

In state both ends in each of the LED chips are connected with each of anode electrode terminals and each of cathode electrode terminals by lead, the anode electrode terminals of the plurality of LED chips are connected in common by the second electrode connection wire, and the cathode electrode terminals of the plurality of LED chips 150 are connected in common by the first electrode connection wire.

At this time, the LED chips emit monochromatic light, tri-chromatic light of R, G and B, or white light.

In another aspect, an LED lamp unit includes an optical lens having an edge in shape of a flat surface or in shape of a convex lens; a plurality of LED chips arranged at fixed intervals in a lower portion of the optical lens; a lower reflecting sheet positioned on a bottom surface of the optical lens and the LED chips; and an upper reflecting sheet positioned on an upper surface of the optical lens.

Also, the upper surface, on which the upper reflecting sheet is positioned, is formed as a flat surface.

In another aspect, an LED lamp unit includes an optical lens having an edge in shape of a flat surface or in shape of a convex lens; a plurality of LED chips arranged at fixed intervals in a lower portion of the optical lens; a lower reflecting sheet positioned on a bottom surface of the optical lens and the LED chips; and a light-absorbing film or a light-scattering film positioned on an upper surface of the optical lens.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 3B illustrates polar coordinates of the relative intensity characteristics of light by an angular degree of a general LED lamp;

DETAILED DESCRIPTION OF THE ILLUSTRATED EMBODIMENTS

Reference will now be made in detail to embodiments of the present invention, examples of which are illustrated in the accompanying drawings. Wherever possible, the same reference numbers will be used throughout the drawings to refer to the same or like parts.

Hereinafter, an LED lamp unit according to the present invention will be described with reference to the accompanying drawings.

Figure 1A:
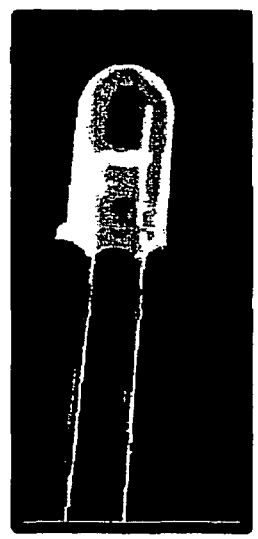
FIG. 1A is a photograph of a general LED lamp unit.
Figure 1B:
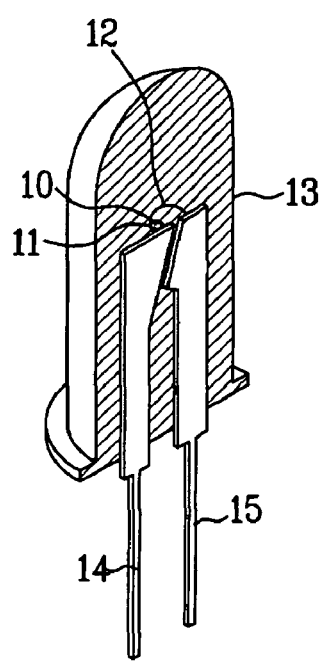
FIG. 1B is a cross sectional view of a general LED lamp unit.
Figure 2:
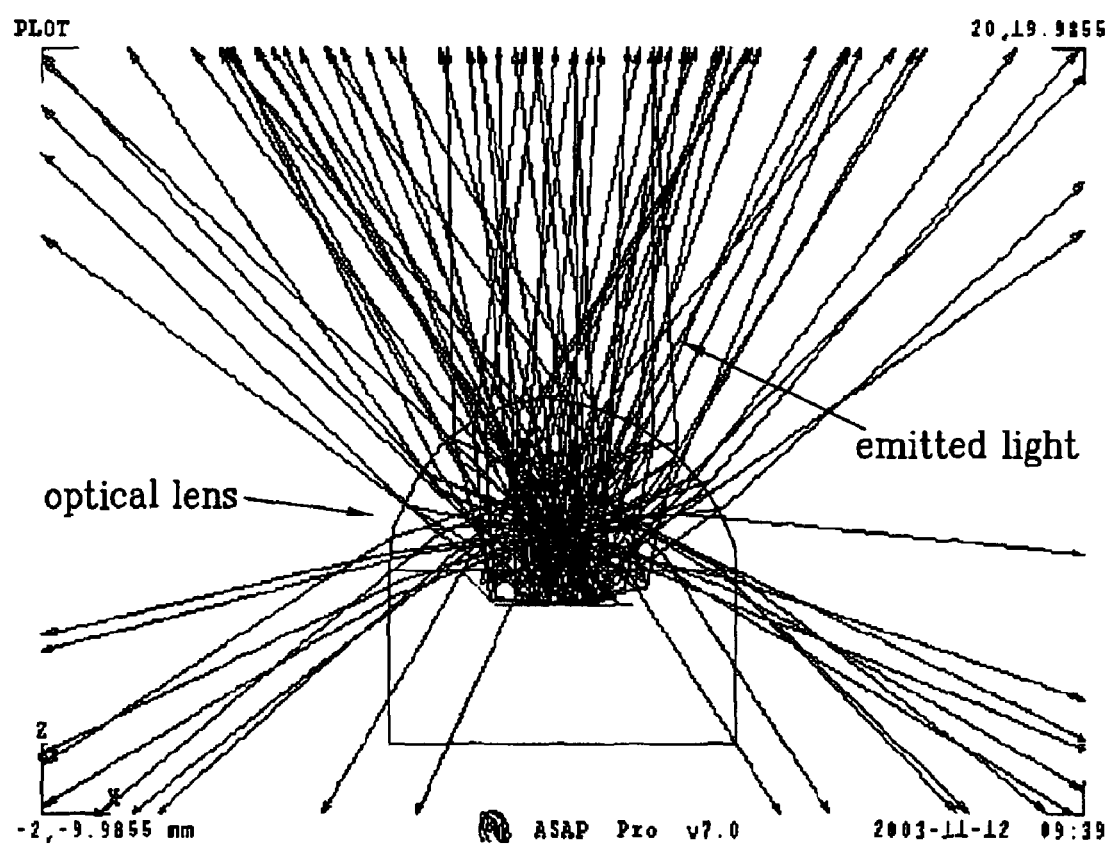
FIG. 2 illustrates a progressing path of light emitted from an LED lamp of FIG. 1A and FIG. 1B.
Figure 3A:
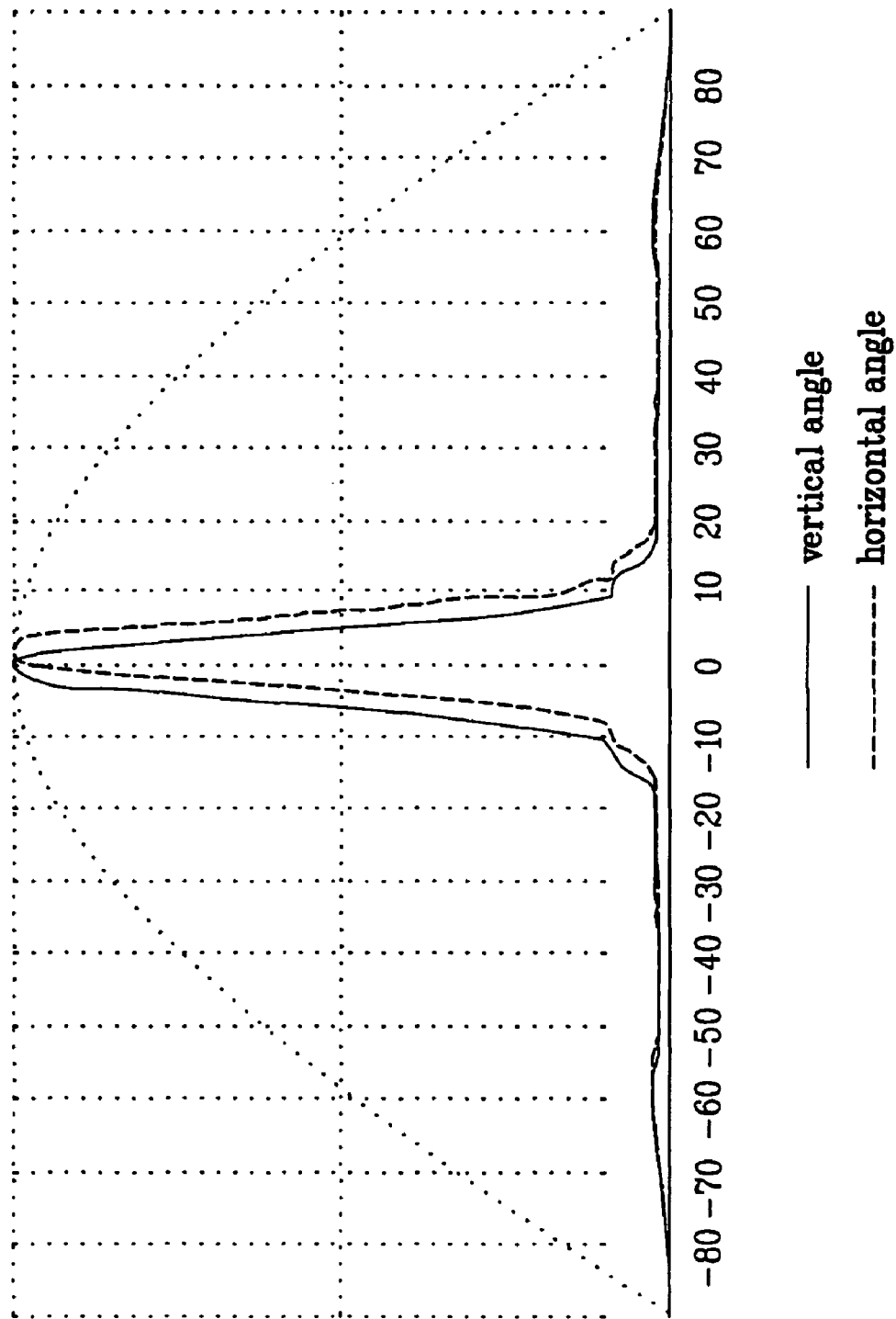
FIG. 3A illustrates rectangular coordinates of the relative intensity characteristics of light by an angular degree of a general LED lamp.
Figure 4:
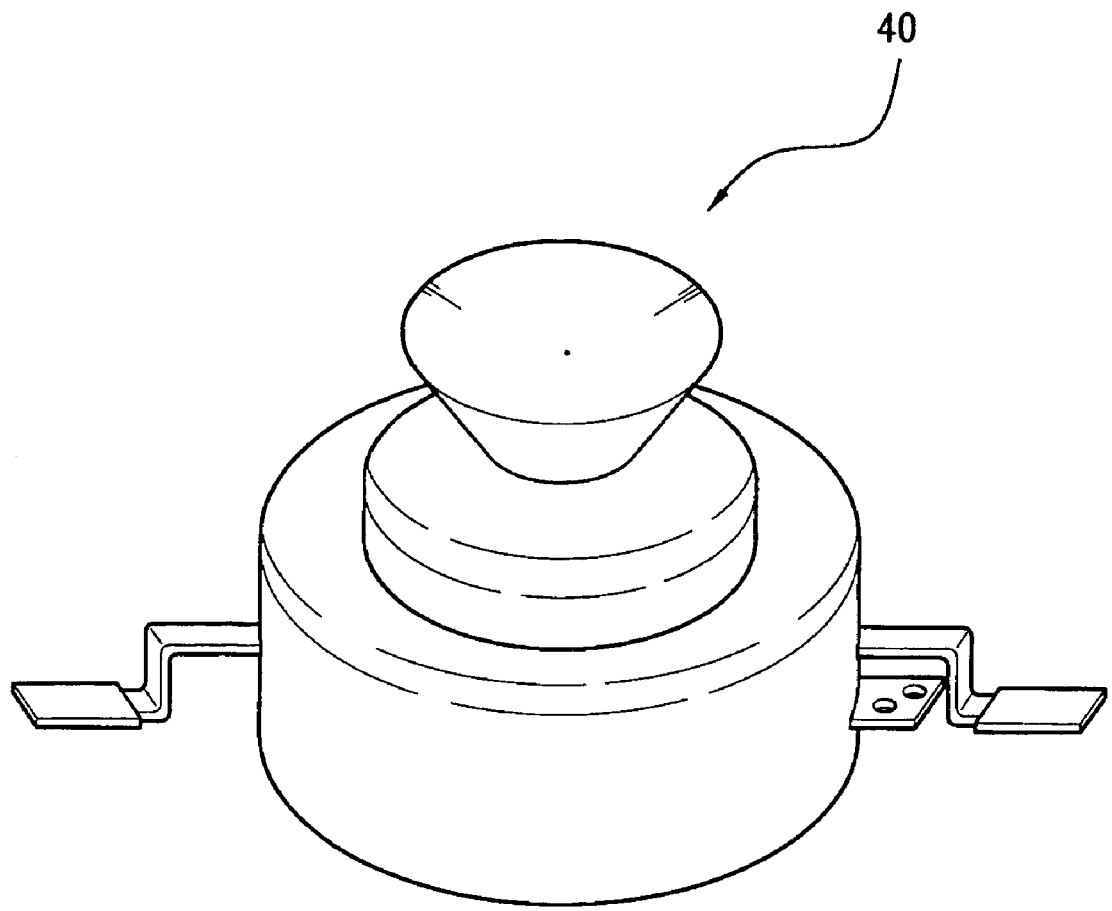
FIG. 4 is a schematic view of an LED lamp unit according to the related art.
Figure 5:
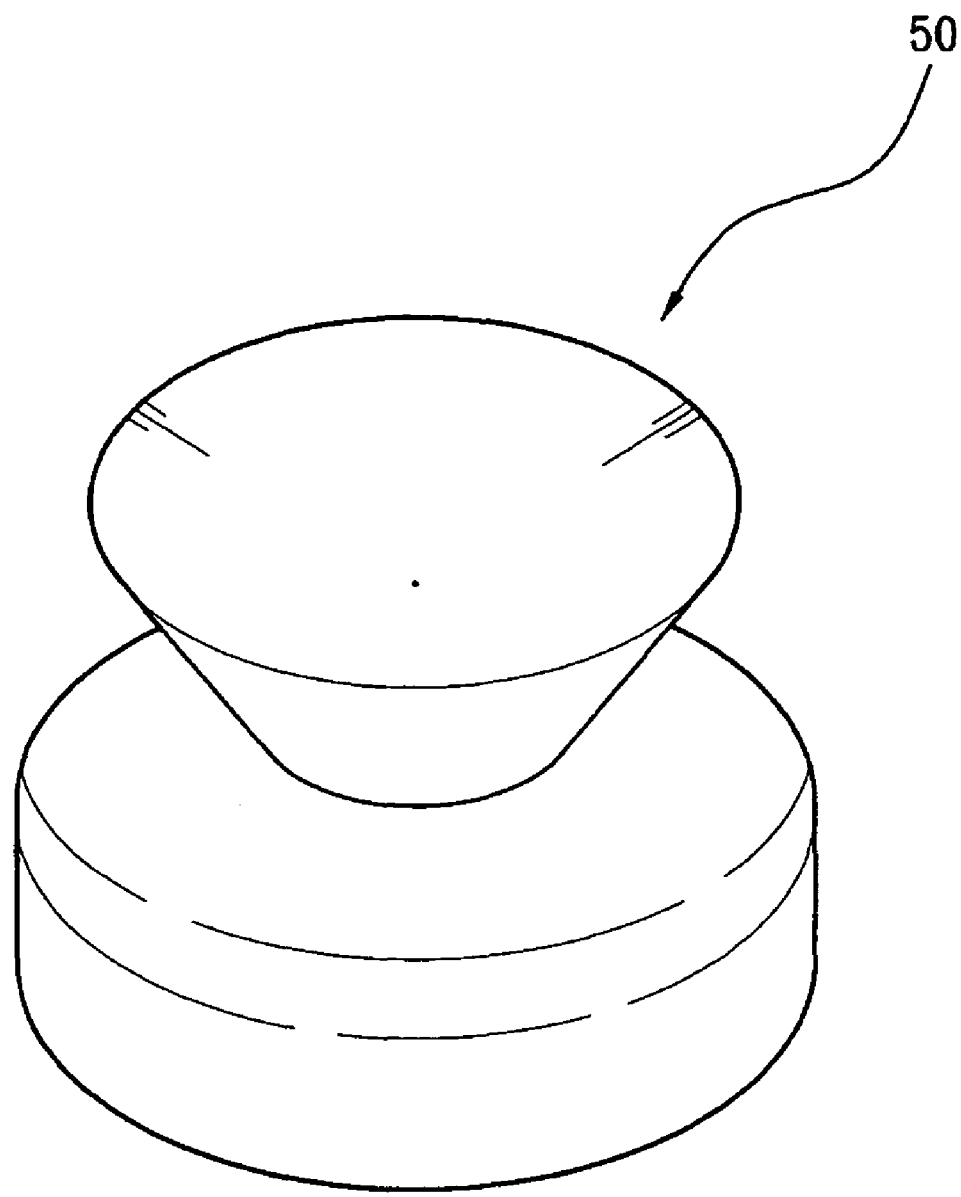
FIG. 5 is a perspective view of an optical lens in an LED lamp of FIG. 4.
Figure 6:
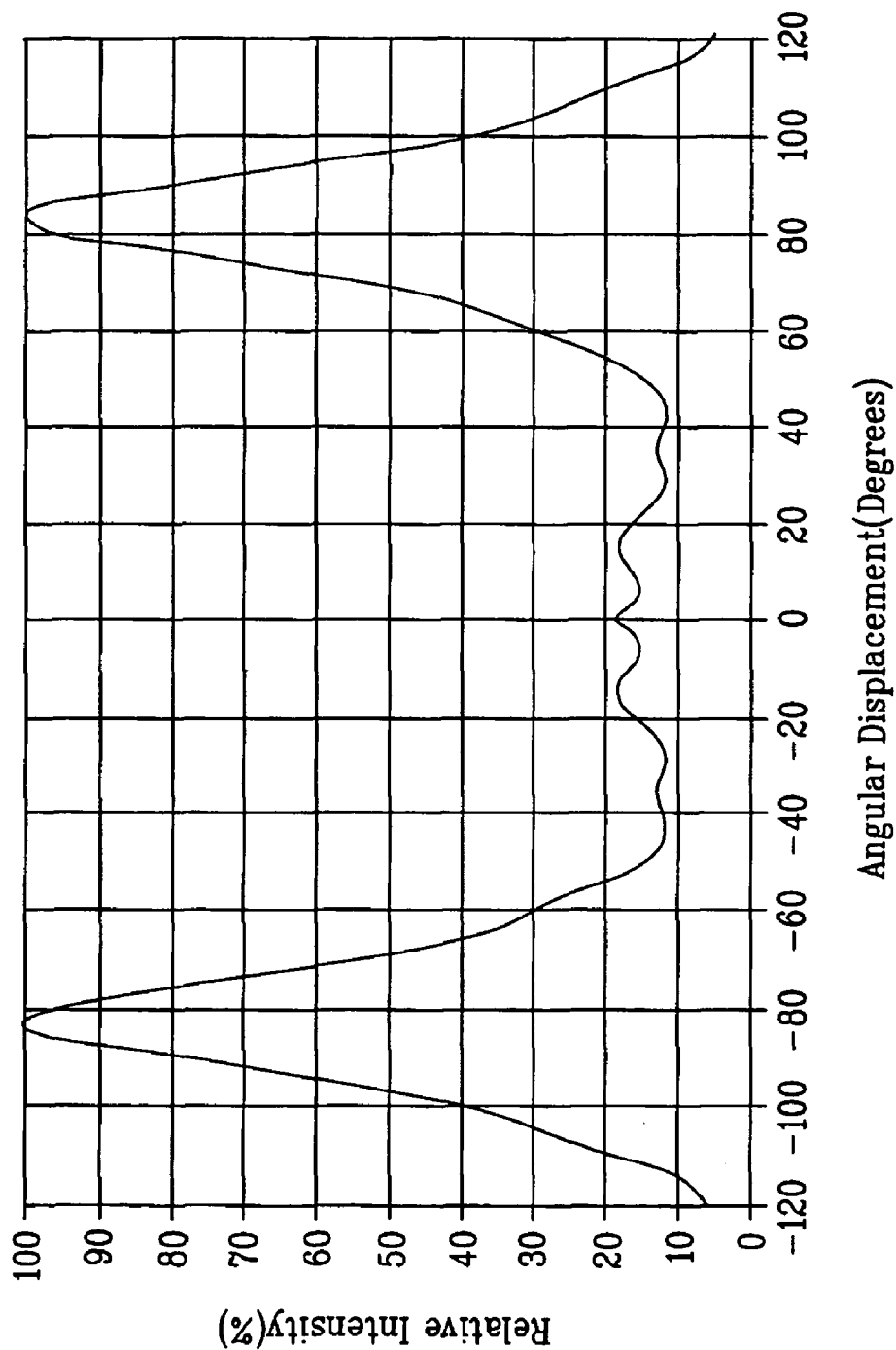
FIG. 6 illustrates a relative intensity according to an angular degree of an LED lamp unit of FIG. 4.
Figure 7:
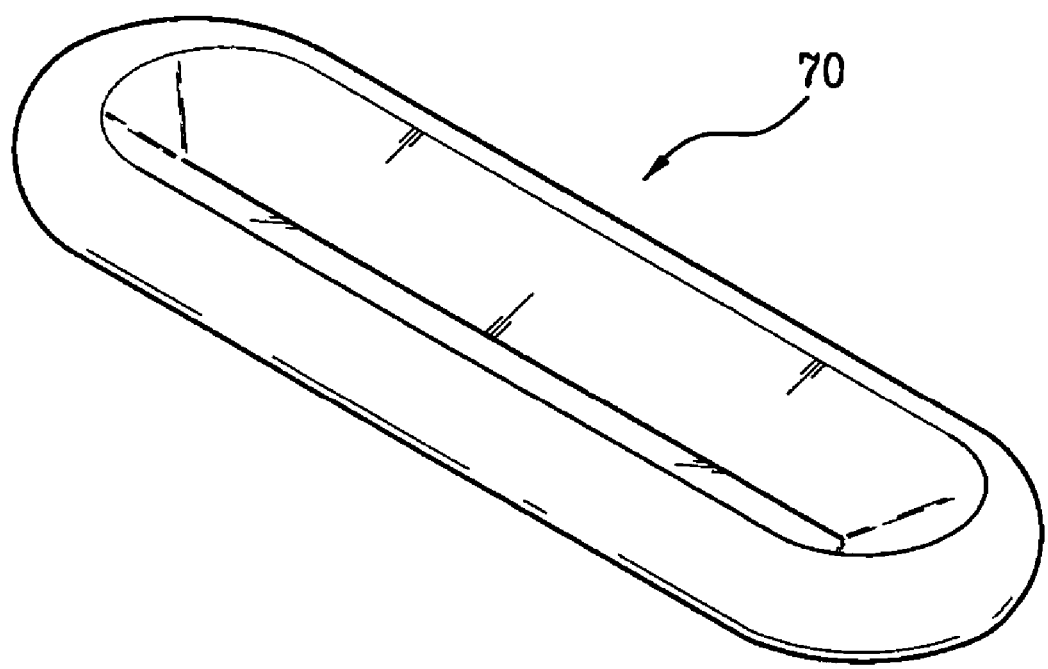
FIG. 7 and FIG. 8 are perspective views of an LED lamp unit according to the first embodiment of the present invention.
Figure 8:
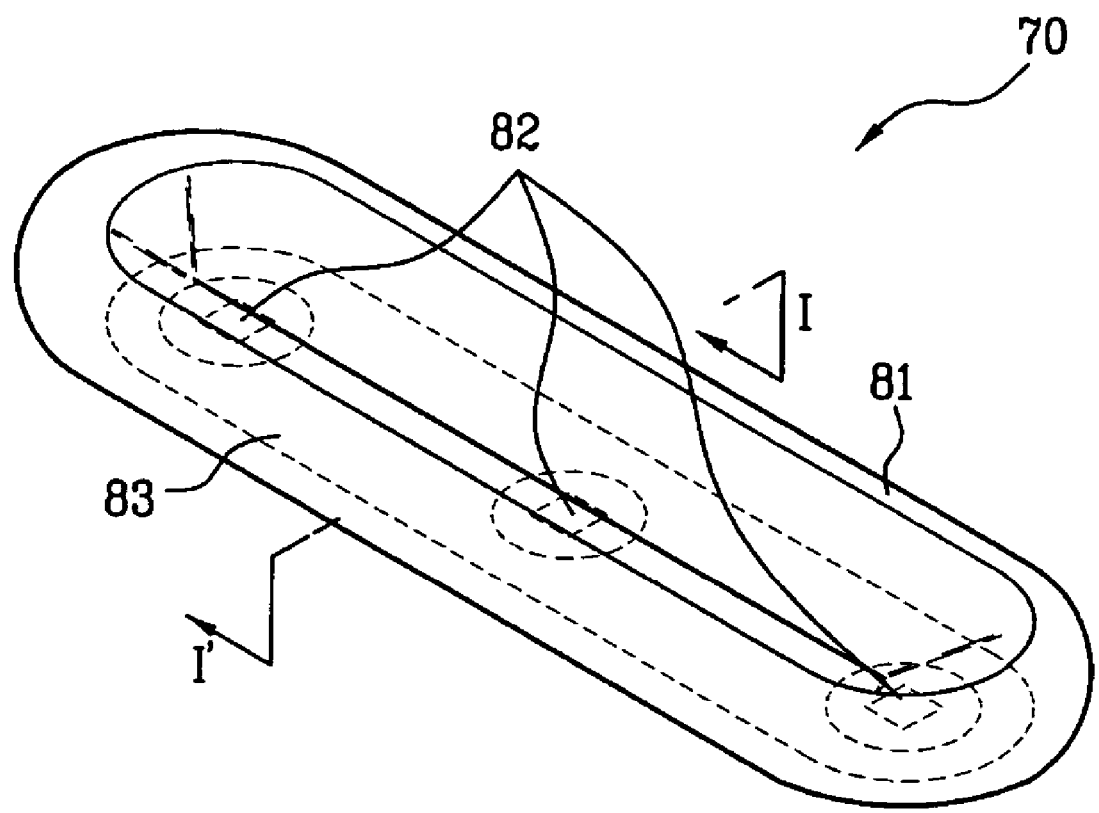
Figure 9A:
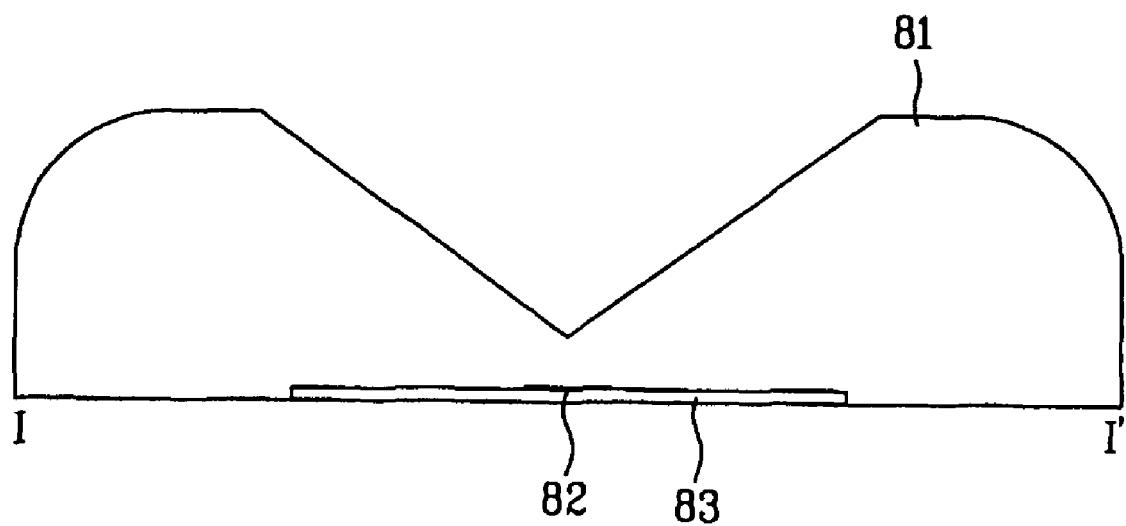
FIG. 9A is a cross sectional view along I-I' of FIG. 8.
Figure 9B:
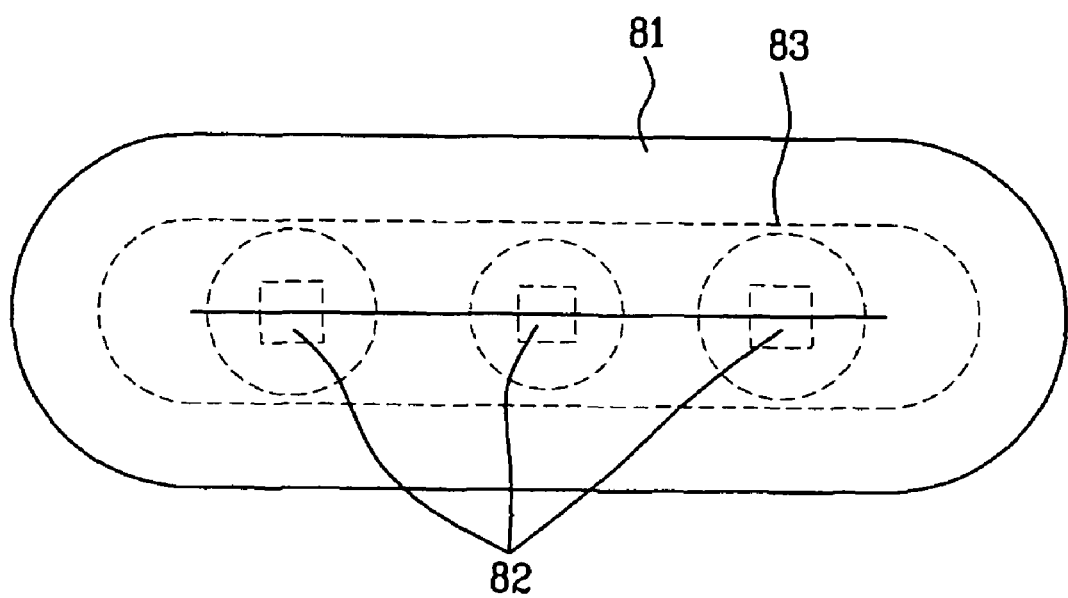
FIG. 9B is a top plane view of an LED lamp unit of FIG. 8.

An LED lamp unit according to the first embodiment of the present invention will be described as follows. FIG. 7 and FIG. 8 are perspective views of an LED lamp unit according to the first embodiment of the present invention. FIG. 9A is a cross sectional view along I-I' of FIG. 8. FIG. 9B is a top plane view of an LED lamp unit of FIG. 8.

As illustrated in FIG. 7 and FIG. 8, the LED lamp unit according to the first embodiment of the present invention is provided with an optical lens 81, an LED chip 82 and a lower reflecting sheet 83. At this time, the optical lens 81 has a central recess part, which is hollowed out or bowed inwardly, wherein the central recess part has a flat surface. Also, the edge of the optical lens 81 is formed as a curved surface in shape of a convex lens. Herein, the edge of the optical lens 81 may have a flat surface, or the central recess part may have a curved surface. In FIG. 9A, the central recess part is formed in shape of 'V'.

The LED chips 82 are arranged at fixed intervals in a lower portion of the optical lens 81 of the LED lamp unit 70. Also, the LED chip 82 emits monochromatic light, tri-chromatic light of R, G and B, or white light. In order to improve the efficiency of light emitted from the LED chip 82, the lower reflecting sheet 83 is positioned on a bottom surface of the optical lens 81.

FIG. 8 illustrates the LED lamp unit having the three LED chips. However, it is possible to provide the LED lamp unit having the plurality of LED chips 82 more than three.

In the LED lamp unit, the plurality of LED chips 82 are positioned on the lower inner surface of the optical lens 81, thereby realizing the thin profile in the LED lamp unit. Also, the edge of the optical lens 81 is formed in shape of the convex lens or the flat surface, whereby the light emitted from the LED chips 82 is mostly guided to the side direction rather than to the front direction.

Also, the aforementioned LED lamp unit may be used as a light-emitting device by itself, or may be used as a light source of a backlight unit for an LCD device.

Figure 10:
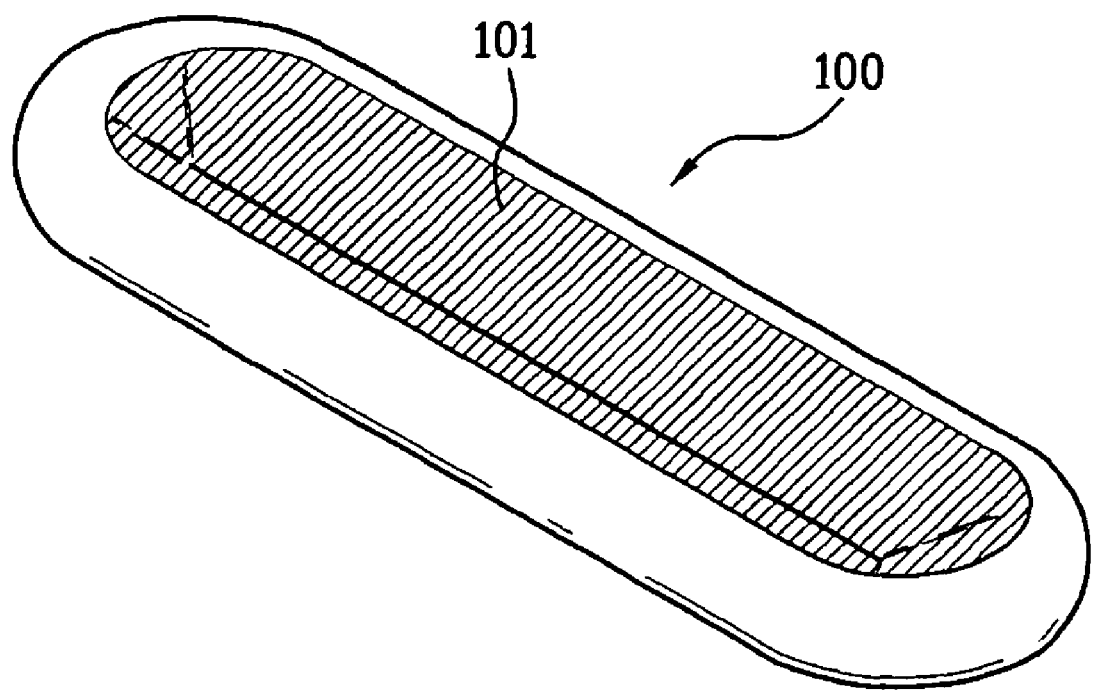
FIG. 10 and FIG. 11 are perspective views of an LED lamp unit according to the second embodiment of the present invention.
Figure 11:
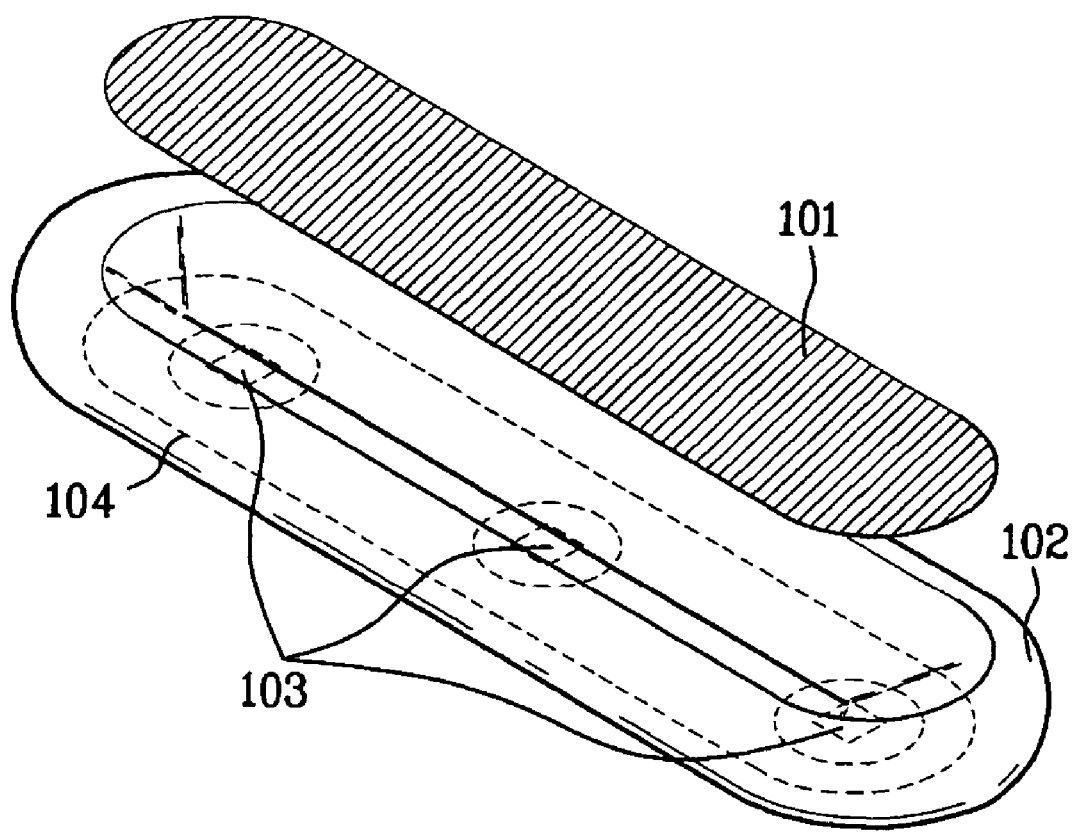

An LED lamp unit according to the second embodiment of the present invention will be described as follows. FIG. 10 and FIG. 11 are perspective views of an LED lamp unit according to the second embodiment of the present invention. With an LED lamp unit according to the second embodiment of the present invention, it is possible to maximize the side elements of light rather than the front elements of light, which is emitted from an LED chip.

As illustrated in FIG. 10 and FIG. 11, the LED lamp unit according to the second embodiment of the present invention is provided with an optical lens 102, a plurality of LED chips 103, a lower reflecting sheet 104, and an upper reflecting sheet 101.

At this time, the optical lens 102 has a central recess part, which is hollowed inwardly, wherein the central recess part has a flat surface. Also, the edge of the optical lens 102 is formed as a curved surface in shape of a convex lens. Herein, the edge of the optical lens 102 may have a flat surface, or the central recess part may have a curved surface. In the drawings, the central recess part is formed in shape of 'V'.

The plurality of LED chips 103 are arranged at fixed intervals in a lower portion of the optical lens 102 of the LED lamp unit 100. Also, the LED chip 103 emits monochromatic light, tri-chromatic light of R, G and B, or white light. In order to improve the efficiency of light emitted from the LED chip 103, the lower reflecting sheet 104 is positioned on a bottom surface of the optical lens 102.

Also, the upper reflecting sheet 101 is provided to cover an entire upper surface of the optical lens 102, thereby minimizing the front elements of light emitted from the LED chip 103, and maximizing the side elements of light emitted from the LED chip 103. That is, the light emitted to the front direction from the LED chip 103 is reflected for being guided to the side direction of the LED chip 103. The upper reflecting sheet 101 may be formed by adhesion of a reflecting sheet, by coating of a reflecting material, or by processing a surface with a functional sheet.

Instead of the upper reflecting sheet 101, a light-absorbing film or a light-scattering film may be provided to prevent the light from being emitted to the front direction. At this time, the light-absorbing film may be formed in a method of adhering to a black sheet. Also, the light-scattering film may be formed in a method of roughing a surface of a film, or in a method of coating irregular particles on a surface of a film.

In the LED lamp unit according to the second embodiment of the present invention, it is possible to maximize the side elements of light rather than the front elements of light, which is emitted from the LED chip.

Also, in the LED lamp unit according to the second embodiment of the present invention as illustrated in FIG. 10 and FIG. 11, it is possible not to form the central recess part in the optical lens 102. That is, the central part of the optical lens 102 may have the flat surface, and the edge of the optical lens 102 may be formed as the curved surface in shape of the convex lens. Then, one or more LED chips 103 are arranged at fixed intervals in the lower portion of the optical lens 102 of the LED lamp unit 100. In order to improve efficiency of light emitted from the LED chip 103, the lower reflecting sheet 104 is positioned on the bottom surface of the optical lens 102. In addition, the upper reflecting sheet 101, the light-absorbing film, or the light-scattering film may be formed above the upper surface of the optical lens 102. In this case, the upper reflecting sheet 101 is positioned on the center (flat surface) of the optical lens 102.

Figure 14A:
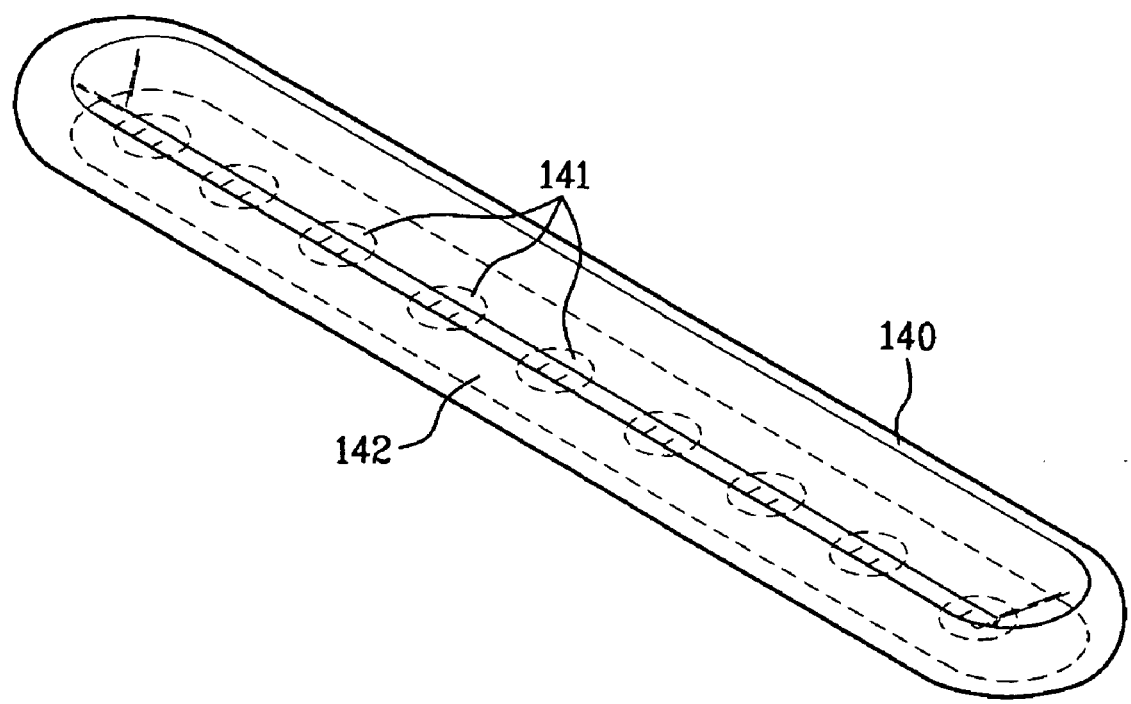
FIG. 14A and FIG. 14B are respectively a perspective view and a top plane view of an LED lamp unit having at least three LED chips according to the present invention.
Figure 14B:
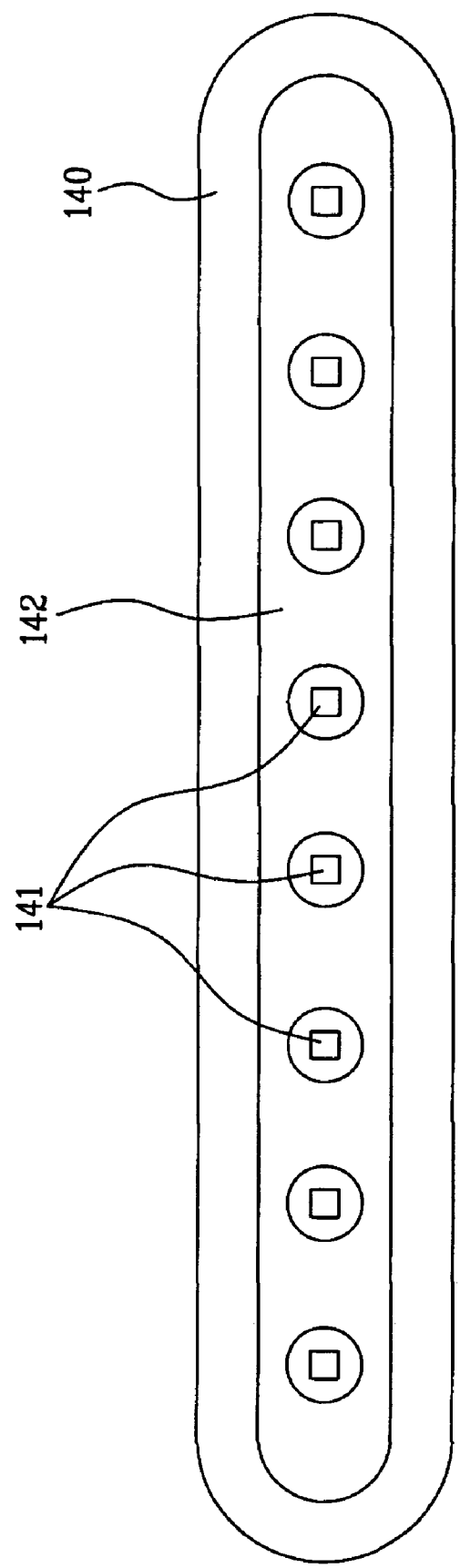

Although not illustrated, the LED lamp unit according to the second embodiment of the present invention, having the upper reflecting sheet 101 formed above the entire upper surface of the optical lens 102, may have the plurality of LED chips, as illustrated in FIG. 14A and FIG. 14B.

Also, the aforementioned LED lamp unit may be used as a light-emitting device by itself, or may be used as a light source of a backlight unit for an LCD device.

The characteristics of light emitted from the LED lamp unit according to the first and second embodiments of the present invention will be described as follows.

Figure 12:
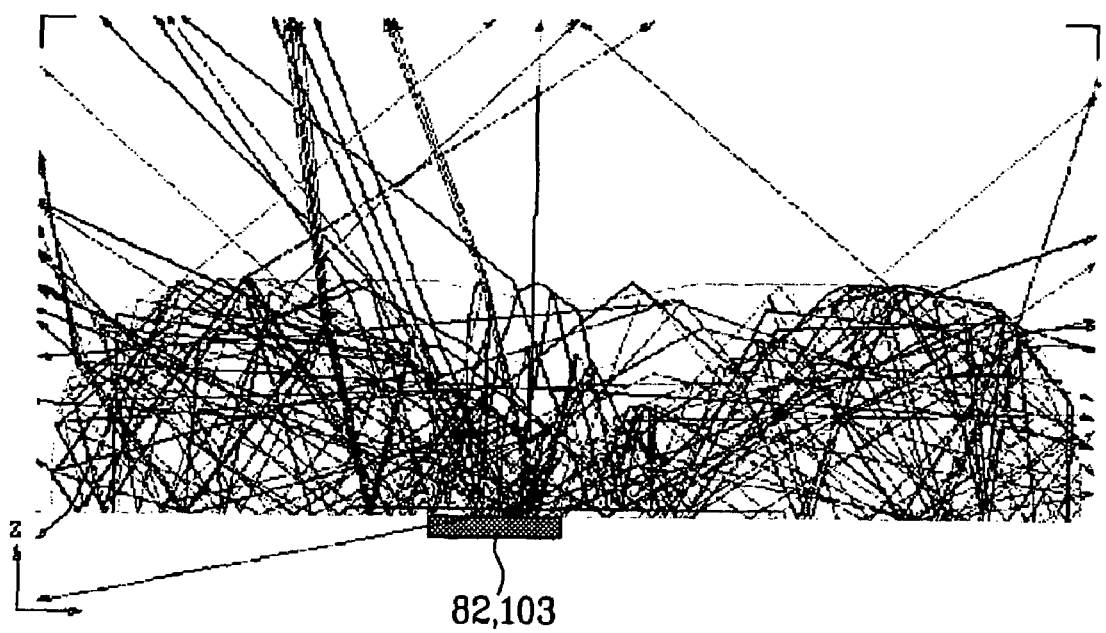
FIG. 12 illustrates a progressing path of light emitted from LED lamps according to the first and second embodiments of the present invention.
Figure 13A:
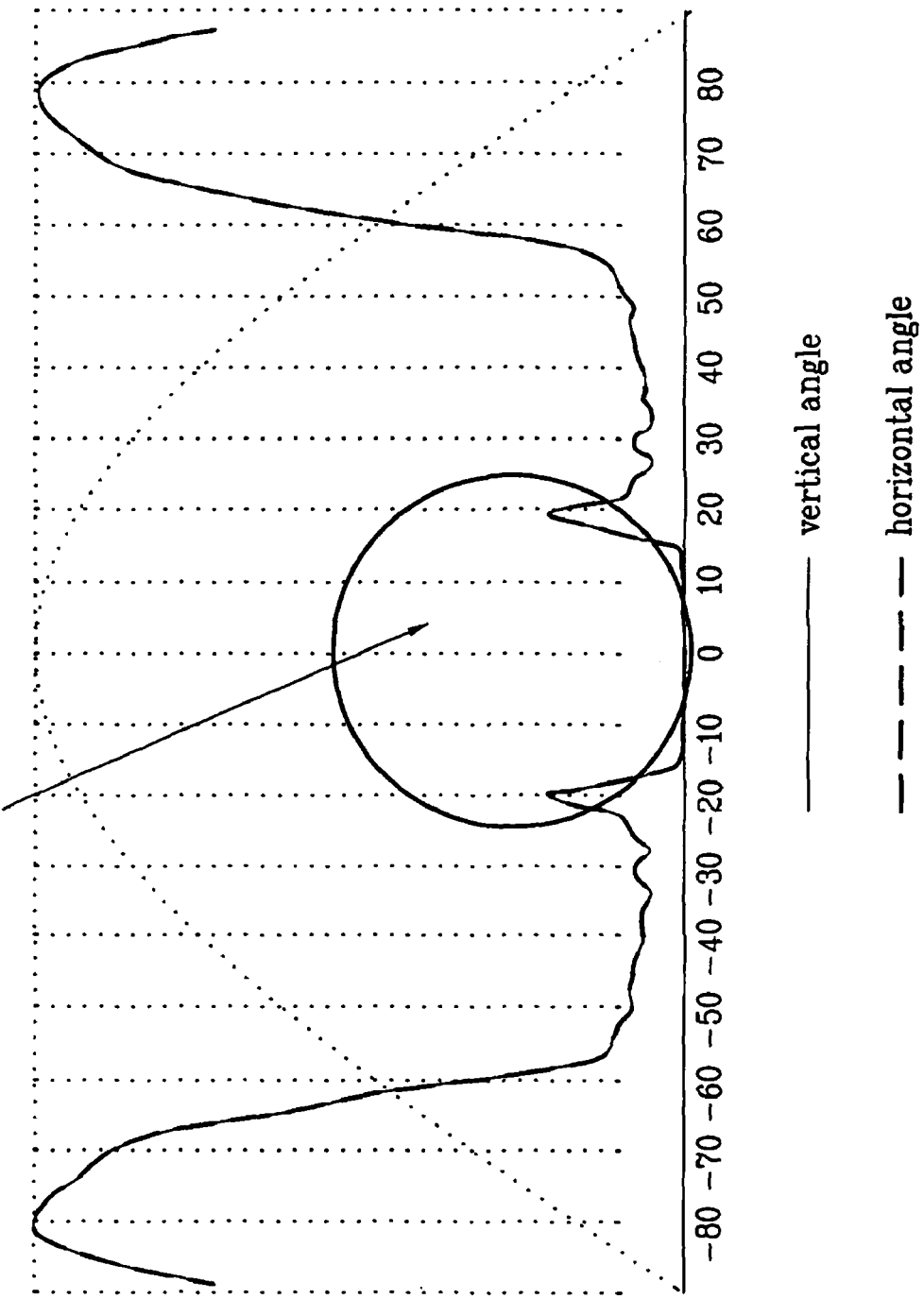
FIG. 13A illustrates rectangular coordinates of the relative intensity characteristics of light by an angular degree of an LED lamp according to the present invention.
Figure 13B:
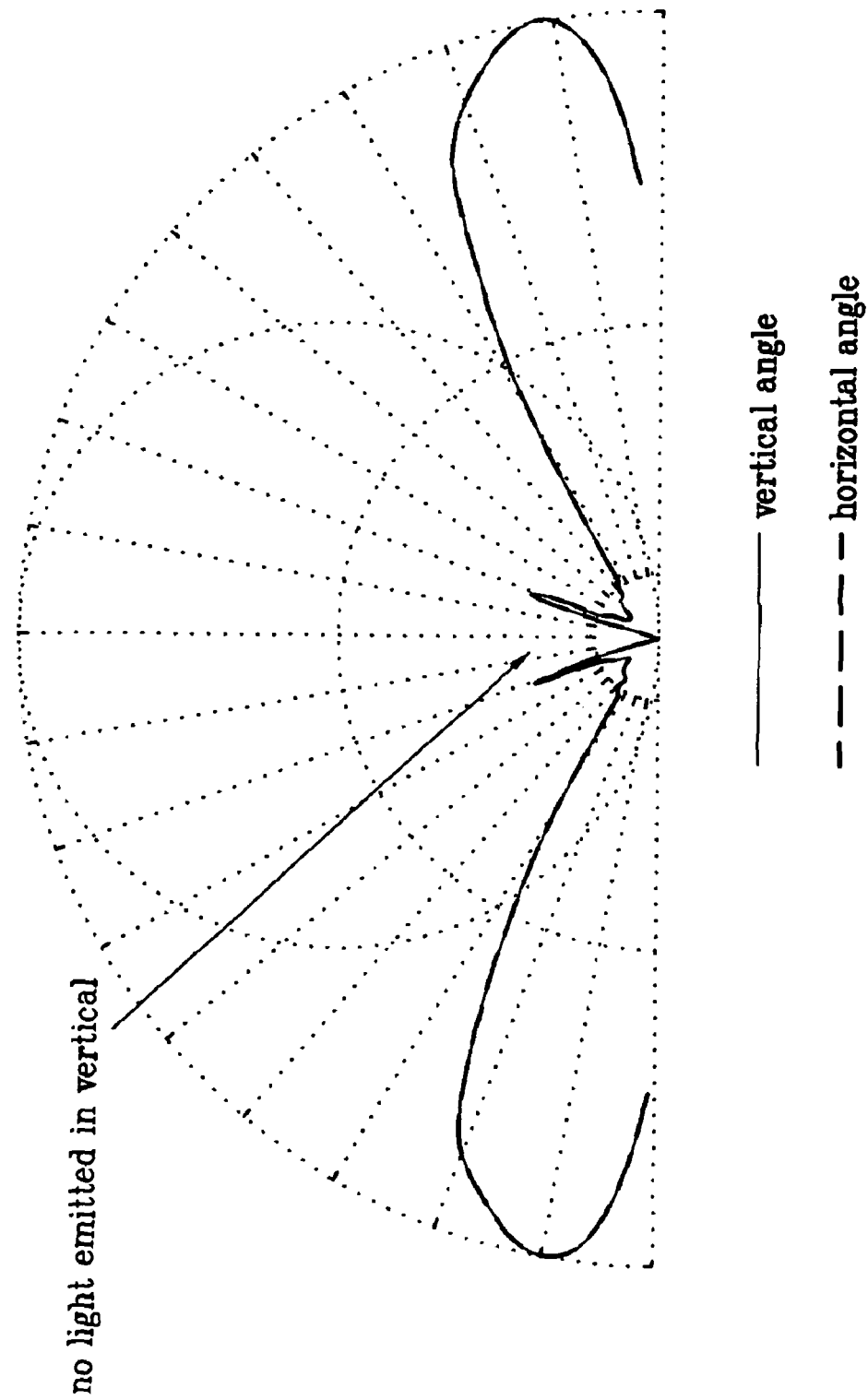
FIG. 13B illustrates polar coordinates of the relative intensity characteristics of light by an angular degree of an LED lamp according to the present invention.

FIG. 12 illustrates a progressing path of light emitted from the LED lamp unit according to the first and second embodiment of the present invention. FIG. 13A and FIG. 13B respectively illustrate rectangular and polar coordinates of the relative intensity characteristics of light by an angular degree of the LED lamp according to the present invention.

With an LED lamp unit according to the first and second embodiments of the present invention, as illustrated in FIG. 12, the light emitted from the LED chip 82, 103 progresses toward the side direction rather than to the front direction. Also, as illustrated in the rectangular and polar coordinates of FIG. 13A and FIG. 13B, there is scarcely any light emitted from the LED chip 82, 103 in the vertical direction. Accordingly, the light is mostly emitted from the LED chip 82, 104 in the horizontal direction, that is, toward the side.

In contrast to the related art lamp units, in an LED lamp unit according to the present invention, the side elements of light increase, and the front elements of light decrease, whereby it is possible to improve the uniformity of light when the LED lamp unit according to the present invention is used for the light source of the backlight. That is, the LED lamp unit according to the present invention is appropriate to the backlight unit of the LCD device.

FIG. 14A is a perspective view of an LED lamp unit having at least three LED chips according to the present invention. FIG. 14B is a top plane view of an LED lamp unit having at least three LED chips according to the present invention.

In the LED lamp unit according to the first and second embodiments of the present invention, three LED chips are provided. However, if an optical lens 140, a lower reflecting sheet 142 and an upper reflecting sheet are formed in the same structure as those in the LED lamp unit according to the first and second embodiments of the present invention, three or more LED chips 141 may be formed as illustrated in FIG. 14A and FIG. 14B.

Next, exemplary electric connection methods for driving the LED lamp unit according to the present invention will be described with reference to the accompanying drawings.

FIG. 15 to FIG. 18 are exemplary views of various electric connections in an LED lamp unit according to the present invention. For driving the LED lamp unit according to the present invention, it is necessary to apply the voltage to respective LED chips, of which electric connections will be described as follows.

As illustrated in FIG. 15 to FIG. 18, the plurality of LED chips 150 are provided, wherein both ends in each of the plurality of LED chips 150 are connected with an anode electrode terminal 151 and a cathode electrode terminal 152 by lead.

The anode electrode terminal 151 and the cathode electrode terminal 152 connected with the LED chip 150 may have the various connection states, as follows.

Figure 15:
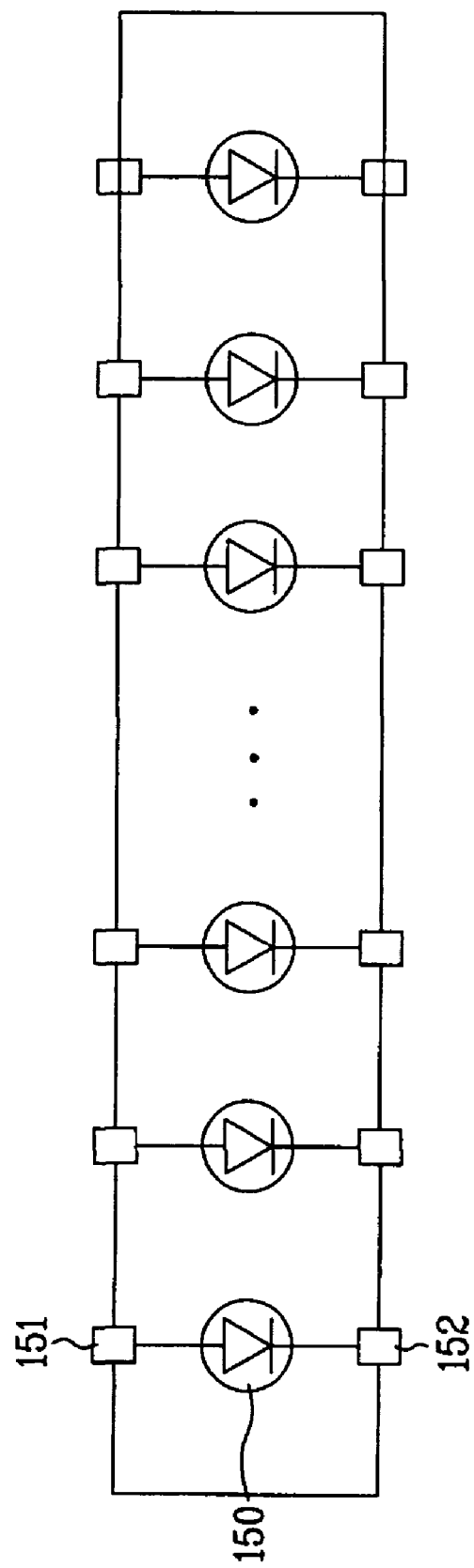
FIG. 15 to FIG. 18 are exemplary views of various electric connections in an LED lamp unit according to the present invention.

In FIG. 15, the anode electrode terminals 151 of the plurality of LED chips 150 are separately connected, and the cathode electrode terminals 152 of the plurality of LED chips 150 are separately connected, whereby the voltage is individually applied to each of the LED chips 150.

Figure 16:
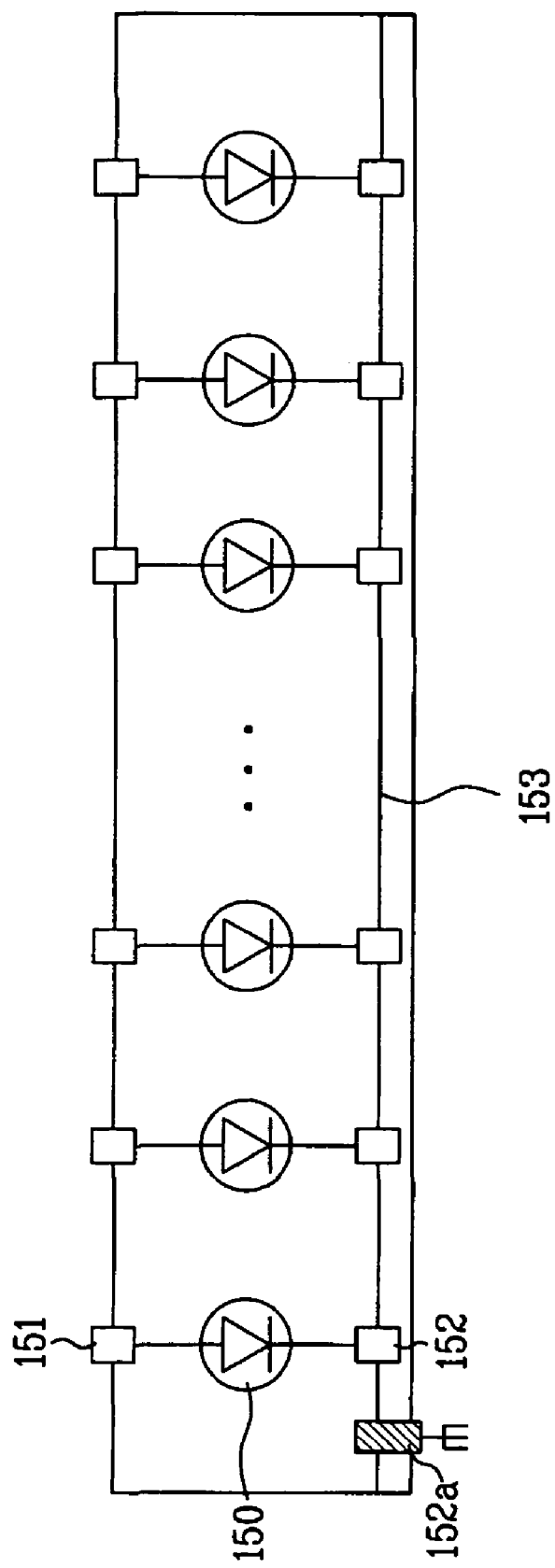

In FIG. 16, the anode electrode terminals 151 of the plurality of LED chips 150 are separately connected, whereby the voltage is individually applied to one end in each of the LED chips 150. Then, the cathode electrode terminals 152 of the plurality of LED chips 150 are connected in common by a first electrode connection wire 153.

Figure 17:
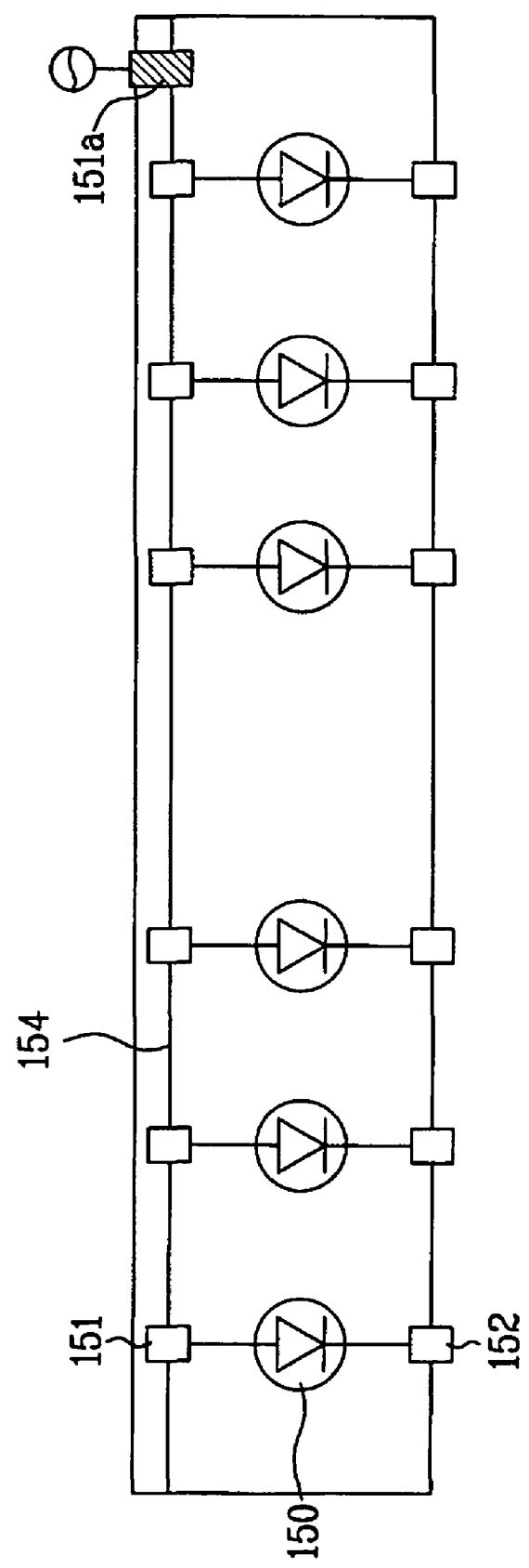

In FIG. 17, the anode electrode terminals 151 of the plurality of LED chips 150 are connected in common by a second electrode connection wire 154. Then, the cathode electrode terminals 152 of the plurality of LED chips 150 are separately connected, whereby the voltage is individually applied to the other end in each of the LED chips 150.

Figure 18:
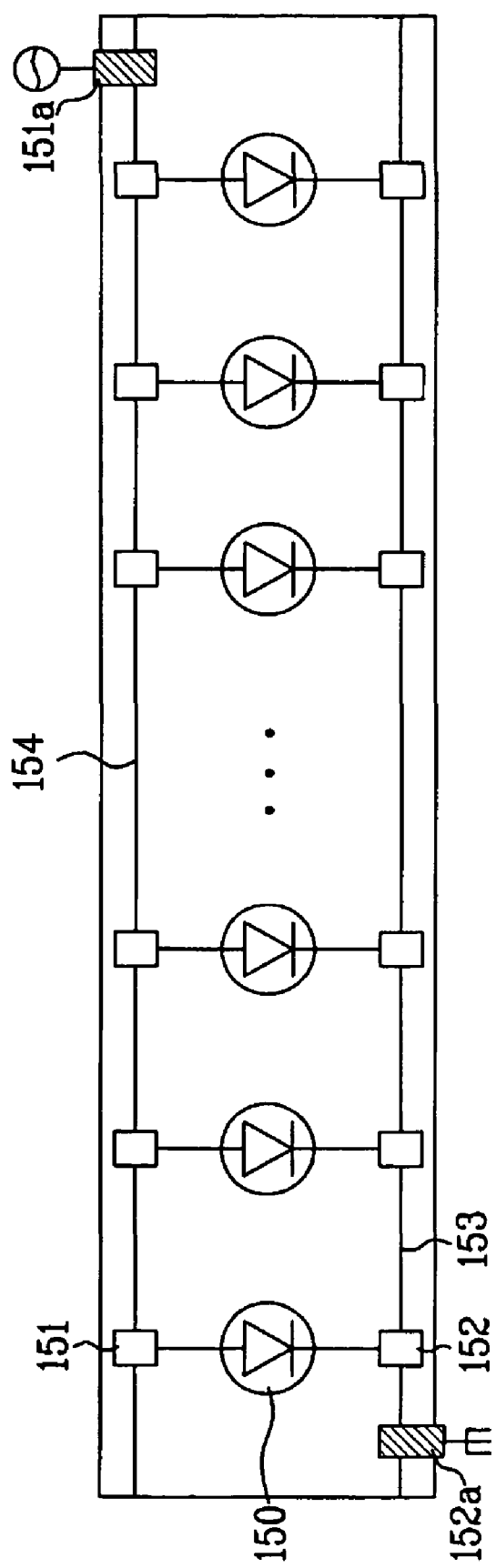

In FIG. 18, the anode electrode terminals 151 of the plurality of LED chips 150 are connected in common by the second electrode connection wire 154. Then, the cathode electrode terminals 152 of the plurality of LED chips 150 are connected in common by the first electrode connection wire 153.

Herein, non-explained reference numbers 151a and 152a are first and second common electrode applying terminals for applying common voltages to the respective anode and cathode electrode terminals. The cathode electrode terminals 152 may be grounding separately, or may be grounding in common.

Accordingly, it is possible to simply apply the power to the both ends of the LED chips by the lead and electrode connection wires, thereby realizing the simplified electric connection of the LED lamp unit.

As described above, the LED lamp unit according to the present invention has the following advantages.

First, the edge of the optical lens is formed in shape of the convex lens, or in shape of the flat surface, whereby the light emitted from the LED chip is mostly progressing to the side direction, thereby improving the uniformity of light.

Also, the edge of the optical lens is formed in the convex lens or the flat surface, and the LED chip is provided in the lower inner side of the optic lens. As a result, the LED lamp unit according to the present invention has a thinner profile as compared with the related art.

Furthermore, the light emitted from the LED chip is mostly progressing to the side direction. Accordingly, in case the LED lamp unit according to the present invention is applied to the backlight unit of the LCD device, it is possible to improve the display degree by increasing the uniformity of light.

In addition, it is possible to simply apply the power to the both ends of the LED chips by the lead and the electrode connection wire, thereby realizing the simplified electric connection of the LED lamp unit.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. An LED lamp unit for a liquid crystal display device comprising:

one or more LED chips for emitting light;

an optical lens for transmitting and refracting light emitted from the one or more LED chips, the optical lens having a central recess part, the central recess part having a depth, length and width, wherein the length of the central recess part is greater than the width of the central recess part, wherein the optical lens has a length in the same direction as the length of the central recess part, width in the same direction as the width of the central recess part and height in the same direction as the height of the central recess part, wherein the length of the optical lens is greater than the width of the optical lens, wherein the width of the optical lens is greater than the height of the optical lens, wherein the depth of the central recess part is most of the height of the optical lens, wherein the central recess part is hollowed inwardly, and wherein the central recess part is surrounded by an elevated edge which is formed in a shape of a convex lens, wherein the elevated edge is positioned at a side direction of the central recess part, wherein the one or more LED chips are arranged at fixed intervals in a lower portion of the optical lens; and a lower reflecting sheet positioned on a bottom surface of the one or more LED chips, wherein the light emitted from at least one LED chip is mostly progressing to the side direction by the optical lens.

2. The LED lamp unit of claim 1, wherein the central recess part has a V-shape.

3. The LED lamp unit of claim 1, wherein the central recess part of the optical lens has a flat surface or a curved surface.

4. The LED lamp unit of claim 1, further comprising an upper reflecting sheet on an upper surface of the optical lens.

5. The LED lamp unit of claim 1, further comprising a light-absorbing film or a light-scattering film on the upper surface of the optical lens.

6. The LED lamp unit of claim 5, wherein the light-absorbing film is a black sheet.

7. The LED lamp unit of claim 1, wherein each of the LED chips are connected with each of anode electrode terminals and each of cathode electrode terminals by lead, the anode electrode terminals of the LED chips are separately connected, and the cathode electrode terminals of the LED chips are separately connected.

8. The LED lamp unit of claim 1, wherein each of the LED chips are connected with each of anode electrode terminals and each of cathode electrode terminals by lead, the anode electrode terminals of the LED chips are separately connected, and the cathode electrode terminals of the LED chips are connected in common by a first electrode connection wire.

9. The LED lamp unit of claim 1, wherein each of the LED chips are connected with each of anode electrode terminals and each of cathode electrode terminals by lead, the anode electrode terminals of the LED chips are connected in common by a second electrode connection wire, and the cathode electrode terminals of the LED chips are separately connected.

10. The LED lamp unit of claim 1, wherein each of the LED chips are connected with each of anode electrode terminals and each of cathode electrode terminals by lead, the anode electrode terminals of the LED chips are connected in common by the second electrode connection wire, and the cathode electrode terminals of the LED chips are connected in common by the first electrode connection wire.

11. The LED lamp unit of claim 1, wherein the LED chips emit monochromatic light, tri-chromatic light of R, G and B, or white light.

12. The LED lamp unit of claim 1, wherein the edge has a flat surface.

13. The LED lamp unit of claim 1, wherein the depth of the central recess part is less than the width of the central recess part.

14. The LED lamp unit of claim 1, wherein the edge has a curved shape when viewed from the length and width directions.

15. The LED lamp unit of claim 1, wherein the LED chips are on the lower inner surface of the optical lens.

16. The LED lamp unit of claim 1, wherein an axis of curvature of the convex lens-shaped portions is perpendicular to the depth direction of the central recess part.

17. The LED lamp unit of claim 1, wherein the central recess part includes a valley running parallel to the length of the optical lens.

18. An LED lamp unit comprising:
a plurality of LED chips for emitting light;
an optical lens for transmitting and refracting light emitted from the plurality of LED chips, the optical lens having a recess part, the recess part having a depth, length and width, wherein the length of the recess part is greater than the width of the recess part, wherein the optical lens has a length in the same direction as the length of the recess part, width in the same direction as the width of the recess part and height in the same direction as the height of the recess part, wherein the length of the optical lens is greater than the width of the optical lens, wherein the width of the optical lens is greater than the height of the optical lens, wherein the depth of the recess part is most of the height of the optical lens, and wherein the recess part is surrounded by an elevated edge which is formed in a shape of a convex lens, wherein the elevated edge is positioned at a side direction of the central recess part, wherein the plurality of LED chips are arranged at fixed intervals in a lower portion of the optical lens;

a lower reflecting sheet positioned on a bottom surface of the optical lens and the LED chips; and an upper reflecting sheet positioned on an upper surface of the optical lens, wherein the light emitted from at least one LED chip is mostly progressing to the side direction by the optical lens.

19. The LED lamp unit of claim 18, wherein the upper surface, on which the upper reflecting sheet is positioned, is a flat surface.

20. The LED lamp unit of claim 18, wherein each of the plurality of LED chips are connected with each of anode electrode terminals and each of cathode electrode terminals by lead, the anode electrode terminals of the plurality of LED chips are separately connected, and the cathode electrode terminals of the plurality of LED chips are separately connected.

21. The LED lamp unit of claim 18, wherein each of the plurality of LED chips are connected with each of anode electrode terminals and each of cathode electrode terminals by lead, the anode electrode terminals of the plurality of LED chips are separately connected, and the cathode electrode terminals of the plurality of LED chips are connected in common by a first electrode connection wire.

22. The LED lamp unit of claim 18, wherein each of the plurality of LED chips are connected with each of anode electrode terminals and each of cathode electrode terminals by lead, the anode electrode terminals of the plurality of LED chips are connected in common by a second electrode connection wire, and the cathode electrode terminals of the plurality of LED chips are separately connected.

23. The LED lamp unit of claim 18, wherein each of the plurality of LED chips are connected with each of anode electrode terminals and each of cathode electrode terminals by lead, the anode electrode terminals of the plurality of LED chips are connected in common by the second electrode connection wire, and the cathode electrode terminals of the plurality of LED chips are connected in common by the first electrode connection wire.

24. The LED lamp unit of claim 18, wherein the LED chips emit monochromatic light, tri-chromatic light of R, G and B, or white light.

25. The LED lamp unit of claim 18, wherein the upward-facing flat surface is substantially horizontal.

26. The LED lamp unit of claim 18, wherein the depth of the recess part is less than the width of the recess part.

27. The LED lamp unit of claim 18, wherein the edge has a curved shape when viewed from the length and width directions.

28. The LED lamp unit of claim 18, wherein the LED chips are on the lower inner surface of the optical lens.

29. The LED lamp unit of claim 18, wherein an axis of curvature of the convex lens-shaped portions is perpendicular to the depth direction of the recess part.

30. The LED lamp unit of claim 18, wherein the recess part includes a valley running parallel to the length of the optical lens.

31. An LED lamp unit comprising:
a plurality of LED chips for emitting light;
an optical lens for transmitting and refracting light emitted from the plurality of LED chips, the optical lens having a recess part, the recess part having a depth, length and width, wherein the length of the recess part is greater than the width of the recess part, wherein the optical lens has a length in the same direction as the length of the recess part, width in the same direction as the width of the recess part and height in the same direction as the height of the recess part, wherein the length of the optical lens is greater than the width of the optical lens, wherein the width of the optical lens is greater than the height of the optical lens, wherein the depth of the recess part is most of the height of the optical lens, and wherein the recess part is surrounded by an elevated edge which is formed in a shape of a convex lens, wherein the elevated edge is positioned at a side direction of the central recess part;
wherein the plurality of LED chips are arranged at fixed intervals in a lower portion of the optical lens;
a lower reflecting sheet positioned on a bottom surface of the optical lens and the LED chips; and
a light-absorbing film or a light-scattering film positioned on an upper surface of the optical lens,
wherein the light emitted from at least one LED chip is mostly progressing to the side direction by the optical lens.

32. The LED lamp unit of claim 31, wherein the light-absorbing film is a black sheet.

33. The LED lamp unit of claim 31, wherein the depth of the recess part is less than the width of the recess part.

34. The LED lamp unit of claim 31, wherein the edge has a curved shape when viewed from the length and width directions.

35. The LED lamp unit of claim 31, wherein the LED chips are on the lower inner surface of the optical lens.

36. The LED lamp unit of claim 31, wherein an axis of curvature of the convex lens-shaped portions is perpendicular to the depth direction of the recess part.

37. The LED lamp unit of claim 31, wherein the recess part includes a valley running parallel to the length of the optical lens.

38. An LED lamp unit, comprising:
one or more LED chips for emitting light;
an optical lens for transmitting and refracting light emitted from the one or more LED chips, the optical lens having a recess part, the recess part having a depth, length and width, wherein the length of the recess part is greater than the width of the recess part, wherein the optical lens has a length in the same direction as the length of the recess part, width in the same direction as the width of the recess part and height in the same direction as the height of the recess part, wherein the length of the optical lens is greater than the width of the optical lens, wherein the width of the optical lens is greater than the height of the optical lens, wherein the depth of the recess part is most of the height of the optical lens, wherein the recess part is surrounded by an elevated edge which is formed in a shape of a convex lens, wherein the elevated edge is positioned at a side direction of the central recess part;
wherein the one or more LED chips are arranged at fixed intervals in a lower portion of the optical lens; and
a lower reflecting sheet positioned on a bottom surface of the LED chips,
wherein the light emitted from at least one LED chip is mostly progressing to the side direction by the optical lens.

39. The LED lamp unit of claim 38, wherein an axis of curvature of the convex lens-shaped portions is perpendicular to the depth direction of the recess part.

40. The LED lamp unit of claim 38, wherein the recess part includes a valley running parallel to the length of the optical lens.

41. The LED lamp unit of claim 38, wherein the width of the recess part is most of the width of the optical lens.

42. The LED lamp unit of claim 38, wherein a width of the edge is less than the width of the recess part, the width of the edge being in the same direction as the width of the recess part.

43. The LED lamp unit of claim 38, wherein the edge having the shape of a convex lens extends downward to a bottom of the optical lens.

44. The LED lamp unit of claim 38, wherein a lengthwise end of the optical lens is curved, wherein an axis of curvature of the lengthwise end is parallel to the height direction of the optical lens.

* * * * *